Sept. 24, 1963 B. B. NICHOLS 3,105,158
STEP COUNTER HAVING STORAGE CAPACITOR DISCHARGE THROUGH TRANSISTOR DRIVEN TO SATURATION WITH DIODE REGENERATIVE FEEDBACK
Filed June 29, 1960
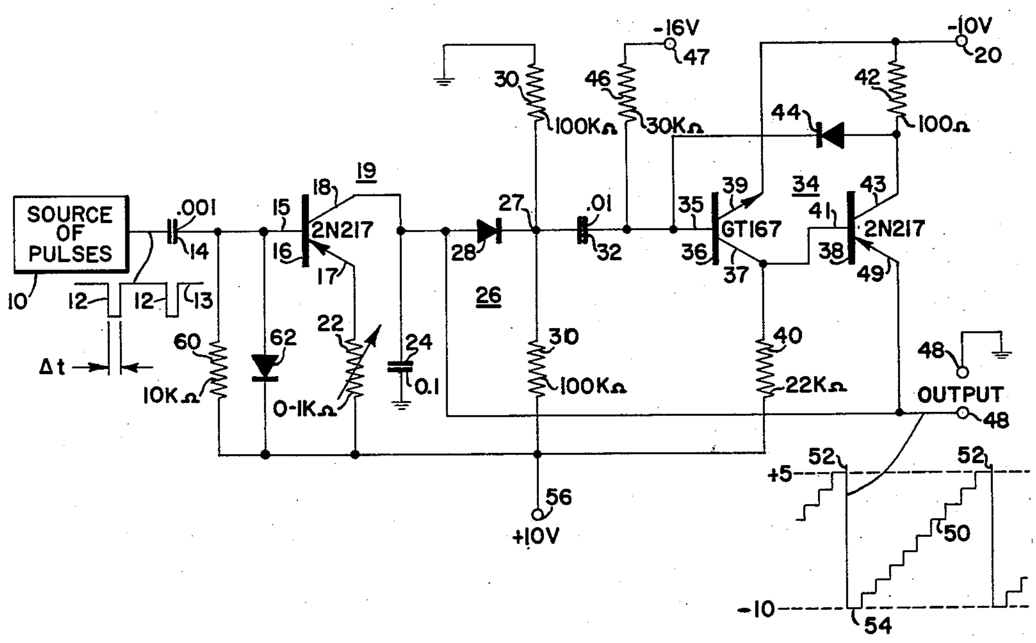
INVENTOR.
BASIL B. NICHOLS
BY C. A. Weigel, Jr.
ATTORNEY 3,105,158

STEP COUNTER HAVING STORAGE CAPACITOR DISCHARGE THROUGH TRANSISTOR DRIVEN TO SATURATION WITH DIODE REGENERATIVE FEEDBACK

Basil B. Nichols, San Diego, Calif., assignor, by mesne assignments, to Daystrom, Incorporated, Murray Hill, N.J., a corporation of Texas Filed June 29, 1960, Ser. No. 39,685
7 Claims. (Cl. 307—88.5)

This invention relates to a switching circuit and more particularly to a transistor circuit for rapidly discharging a capacitive storage device. In a preferred embodiment of this invention, the transistor circuit may be used in a frequency divider of the step counter type.

Step counting circuits are useful as frequency dividers, waveform generators, and the like. Typically, such circuits receive uniform pulse trains, each pulse representing units to be counted. The circuits produce a voltage proportional to the number of pulses received. These step counting circuits usually charge a capacitor through a unilateral conducting device such that the charge on the capacitor is increased slightly during the time of each pulse thereby producing a stepped output voltage. When the output voltage reaches a predetermined value, representing a predetermined number of input pulses, a discharge circuit is activated to discharge the capacitor.

If the accuracy of the circuit as a frequency divider is to be maintained, the capacitor must be discharged relatively quickly, preferably within the period of each input pulse. Further, the discharge circuit must continue to be operative for the duration of that input pulse which initiated the discharge. Otherwise, the capacitor may charge during the latter portion of the input pulse which could result in a false count. Unfortunately, these requirements have been relatively difficult to meet in transistorized step counters because of the lower voltage range over which the transistor operates and because of the different input impedance and control characteristics of vacuum tubes and transistors.

Accordingly, it is an object of this invention to overcome the disadvantages of the prior art.

Another object of this invention is to provide a relatively accurate step counter using transistors.

Still another object of this invention is to provide an improved transistor circuit useful in a step counter type frequency divider for insuring that the frequency divider is responsive initially to a full width input pulse, whereby the accuracy of the frequency divider is improved.

In accordance with one embodiment of the invention, a novel switching circuit using semiconductor devices is used in a step counter type frequency divider. Input pulses to be counted, or divided, charge a capacitive storage device in discrete voltage steps. A diode gate circuit senses when the charge on the capacitive storage device exceeds a predetermined value and passes a trigger pulse to the switching circuit which effects the discharge of the capacitive storage device.

The switching, or discharge circuit includes a pair of opposite conductivity transistors connected in cascade and having regenerative feedback from the output transistor to the input transistor. The capacitive storage device is connected to supply the emitter voltage for the output transistor. In this manner, when the trigger pulse occurs, both transistors are driven into conduction. The regenerative feedback, drives the output transistor into saturation thereby to rapidly discharge the capacitive storage device. Due to the storage effect in the output saturated transistor, the discharge circuit maintains the capacitive storage device discharged for the duration of the input pulse that initiated the discharge, whereby the counting circuit initially responds only to a full width input pulse.

Further advantages and features of this invention will become apparent upon consideration of the following description read in conjunction with the drawing wherein the sole FIGURE is a circuit diagram of a step counter circuit constructed in accordance with the invention.

In the sole figure there is illustrated a source of pulses denoted by the block 10. The pulses are illustrated by the waveform 12 as negative going with respect to a reference voltage level 13. This source of pulses 10 may be any suitable pulse generator such as a blocking oscillator, multivibrator or the like. The pulses 12 from the pulse source 10 are coupled through a coupling capacitor 14 to the base electrode 15 of a PNP type transistor 16 also having an emitter electrode 17 and a collector electrode 18. The transistor 16 is connected as a common emitter amplifier 19. Thus, its emitter electrode 17 is coupled through a variable emitter resistor 22 to a positive current source 56. The current source 56 may, for example, be a battery. The output of the common emitter amplifier 19 is taken from the collector electrode 18 and applied to one side of a storage device, illustrated as a capacitor 24. The other side of the capacitor 24 is returned to ground.

The collector electrode 18 is also connected to a gate circuit 26. The gate circuit 26 includes a unilateral conducting device, or diode 28, connected between the collector electrode 18 and the midpoint 27 of a resistive voltage divider which includes a pair of resistors 30 serially connected between the positive current source 56 and ground. Connected in this manner, the gate 26 allows a voltage pulse to pass through the diode 28 whenever the voltage across the capacitor 24 exceeds (with the circuit parameters illustrated) +5 volts with respect to ground. The output of the gate 26, the common point 27, is then coupled through a coupling capacitor 32 to a discharge circuit 34.

The discharge circuit 34 includes a first NPN transistor 36 having base, collector, and emitter electrodes 35, 37 and 39 respectively, connected as a common emitter amplifier. The discharge circuit 34 also includes a second PNP transistor 38, having base, collector, and emitter electrodes 41, 43 and 49, respectively, also connected as a common emitter amplifier. The emitter electrode 49 of the second transistor 38 is connected serially through the capacitor 24 to ground. Thus, the capacitor 24 supplies the emitter current for the second PNP transistor 38.

The collector electrode 37 of the first transistor 36 is connected through a collector load resistor 40 to the positive current source 56. The emitter electrode 39 of the first transistor 36 is returned to a first negative current source 20. Similarly, the collector electrode 43 of the second transistor 38 is connected through a collector load resistor 42 to the first negative current source 20. A positive feedback connection is made from the collector electrode 43 of the second transistor 38 through a unilateral conducting device, illustrated as a diode 44, poled to pass only positive going signals to the base electrode 35 of the first transistor 36. The first transistor 36, and thus the second transistor 38, are both maintained normally cut off by connecting the base electrode 35 of the first transistor 36 through a bias resistor 46 to a second negative current source 47, which is more negative, with respect to ground, than the first negative current source 20. The output of the step counter is taken from across the storage capacitor 24, such as at output terminals 48.

To aid in describing the operation of the circuit, the several circuit components will be assumed to have typical values such as those illustrated. These typical values are representative of circuit values that have been successfully employed in a circuit in accordance with the invention. The base-to-emitter junction 15—17 of the first transistor 36 is reverse biased by a biasing resistor 60. Also, a diode 62 is connected between the base electrode 15 of the first transistor 16 and the positive current source 56. This diode 62 functions to clamp the base electrode 15 to +10 volts, the value of the positive current source 56, and thus reverse biases the emitter-base junction 17—15 to maintain the input transistor 16 normally non-conducting. In this manner, the input negative going pulses 12 which are to be counted, trigger the normally off, or non-conducting input transistor 16, to an on, or conducting condition. The input transistor 16 conduits for the time duration $\Delta t$ of each of the negative going input pulses 12. The magnitude of the collector current which passes through the capacitor 24 to ground with the occurrence of each input pulse 12, is determined primarily by the emitter resistor 22.

As is known, the fundamental relation between the instantaneous voltage drop *e* across a capacitor having a capacitance C and the current *i* flowing through the capacitor is $\Delta e=(1/C)I\Delta t$. To a good approximation this relation may be expressed for reasonably finite periods of time as $\Delta e=(1/C)i\Delta t$. Therefore, if the charging current *i* is derived from a constant current source and the input pulses 12 to be counted each have the same time duration $\Delta t$, the storage capacitor 24 is charged in discrete equal voltage steps.

To achieve discrete equal voltage steps, the common emitter amplifier 19 is operated as a constant current source. This is important because as long as the storage capacitor 24 is fed from a current source, where the magnitude of the current pulses remain constant, then each voltage step is also of a constant amplitude. Thus the staircase waveform 50 resulting from the fully discharged storage capacitor 24, up to the point of starting the discharge again, follows an almost linear path.

To operate the common emitter amplifier as a constant current source, the capacitor 24 is discharged at a small enough voltage, such as +5 volts with the circuit parameters illustrated, so the input transistor 19 is never allowed to go into saturation. Further, the degenerative effects of the emitter impedance 22 aid in causing the collector 18 to look like a good current source.

Thus, the gate circuit 26 is designed by the divider action of resistors 30, so that when the voltage across the storage capacitor 24 reaches the positive value, with respect to ground, of just 5 volts, the next succeeding pulse causes the diode 28 to conduct in the forward direction. Conduction in the diode 28 results in positive going pulse being passed through the coupling capacitor 32 to forward bias the base-to-emitter junction 35—39 of the first transistor 36 of the capacitor discharge circuit 34. The first transistor 36 is normally biased off by the voltage divider action of resistors 42, 46 and diode 44. The emitter electrode 49 of the second transistor 38 follows the voltage across the capacitor 24 (which is illustrated by the waveform 50), but because the first transistor is biased off, the emitter-to-base junction 49—41 of the second transistor 38 is also cut off.

Thus, with the occurrence of a predetermined charge in the storage capacitor 24, the gate 26 turns the first transistor 36 on. Current flow through the collector load resistor 40 causes the collector potential on the first transistor 36 to drop from its quiescent value of +10 volts toward the −10 volts potential of the negative supply voltage of the first negative current source 20. This collector voltage drop in turn forward biases the emitter-to-base junction 49—41 of the second transistor 38. Collector current flows in the second transistor 38 thereby raising its collector voltage from a quiescent value of −10 volts to that of the potential of the capacitor 24. This rise in collector voltage produces a positive going pulse that passes back through the feedback diode 44 to the base electrode 35 of the first transistor 36. This feedback, which is regenerative, drives the first transistor

36 even harder. The action is cumulative and the second transistor 38 is driven still harder until the second transistor 38 reaches saturation. In saturation, the second transistor 38 quickly discharges the storage capacitor 24 to essentially the potential of the first negative current source 20, namely −10 volts.

As the voltage, and hence the charge on the storage capacitor 24 reaches −10 volts, conduction in the first and second transistors 36 and 38, respectively, ceases since the voltage of the collector source 20 is now substantially the same as the voltage of the emitter source (the capacitor 24). With the cessation of current flow in the second transistor 38, the regenerative feedback action ceases and the first transistor 36 is allowed to return to its quiescent state of non-conduction. The counter is now ready for another cycle.

The output available at the output terminals 48 is illustrated by the waveform 50. This waveform comprises a series of steps corresponding to the incremental charge received by the capacitor 24 with the occurrence of each input pulse 12. With the circuit parameters illustrated, when the voltage across the capacitor reaches a maximum of 15 volts, such that the potential at the output terminals 48 is +5 volts with respect to ground, the next succeeding one of the input pulses 12 passes through the gate circuit 26 such that the capacitor discharge circuit 34 is triggered. Since the discharge circuit 34 requires a finite time to begin discharging, the capacitor, temporarily exceeds +5 volts as illustrated by the small pulse in the shape of a spike 52. However, the voltage at the output terminals 48 quickly drops to −10 volts (54 in the drawing). Due to the storage in the second transistor 38, even though the capacitor 24 may be discharged before the cessation of the particular pulse 52 which initiated its discharge, it is prevented from acquiring any charge from such initiating pulse.

If a transistor is driven to saturation, there is a certain period of time, known as the storage time, during which conduction continues, even though its emitter-to-base junction is no longer forward biased. It is this storage time in the second transistor 38 that maintains the storage capacitor 24 discharged for a finite period of time (greater than $\Delta t$, the time duration of the input pulses 12) even in the continued presence of a charging current from the input transistor 16. The accuracy of the circuit is improved thereby since the circuit is responsive only to full width pulses and is not initially charged, for example, by the last half of the initiating pulse.

In this manner the circuit accurately counts a specific number of pulses prior to its being discharged. If, for example, the capacitor 24 were to acquire some charge from the discharging initiating pulse, such that its potential immediately after discharge were say −9 volts, the gate circuit 26 might recognize and pass the ninth succeeding pulse, instead of the tenth as illustrated.

The emitter resistor 22 is variable so as to vary the current flow to the storage capacitor 24 and hence the modulo of this counter, or frequency divider. If it is desired, for example, to obtain a modulo 10, or decade, counter using the circuit parameters illustrated, if the input pulses 12 are 5 volts in amplitude and 10 microseconds in duration, the emitter resistor should be 330 ohms to limit the charging current to 15 milliamperes (ma.).

Another advantage of the circuit of this invention is that when the output pulses are properly shaped to have a sharp trailing edge, they may be fed into another similar counter circuit to that illustrated, the output of that circuit into another, and so on, so as to make a multiplicity of frequency divisions. As an example, if the first circuit counted 10 kc. pulses to produce 1 kc. pulses, essentially the same circuit may be added to count the 1 kc. pulses and produce 100 cycle pulses in another circuit to produce 10 cycle pulses and so on. Thus, this relatively simple transistor counter, can in a practical application replace a typical phantastron decade counter circuit, which employs vacuum tubes, is more expensive and perhaps less reliable.

There has thus been described a relatively simple circuit that is capable of use, in a pulse counting arrangement, for quickly discharging the storage capacitor. The circuit is relatively accurate when used in a frequency divider and several such circuits may be connected in multiples to achieve frequency division by a relatively large number.

Since many changes could be made in the above construction and many apparently widely different embodiments of this invention could be made without departing from the scope thereof, it is intended that all matter contained in the foregoing description or shown in the accompanying drawing shall be interpreted as being illustrative and not in a limiting sense.

I claim:

1. In a step counter comprising a capacitive storage device, means adapted to receive a series of input pulse signals to be counted, means responsive to said input signals to charge said storage device by discrete increments and means to detect when the charge acquired by said storage device has reached a predetermined value, the combination of a transistor having an input circuit and an emitter-to-collector circuit, said emitter-to-collector circuit being serially and directly connected to said storage device, thereby to provide a discharge path for said storage device, switching means coupled to said input circuit and responsive to said detecting means for switching said transistor from a state of non-conduction to a state of conduction, and regenerative feedback means coupled between said emitter-to-collector circuit and said input circuit thereby to drive said transistor into saturation, whereby said storage device is discharged more quickly.

2. In combination, a transistor having emitter, base, and collector electrodes, first and second terminals adapted to be connected to first and second current sources, a capacitor connected between said first terminal and one of said emitter and collector electrodes, the other one of said emitter and collector electrodes being connected to said second terminal, means adapted to receive input pulses to be counted, means responsive to said last named means to charge said capacitor in discrete steps with the occurrence of each of said pulses, and means for switching said transistor from a state of non-conduction to a state of conduction when said capacitor has acquired a predetermined charge, and regenerative feedback means coupled between said base and said other one of said emitter and collector electrodes thereby to drive said transistor into saturation, whereby said capacitor is quickly discharged and remains discharged for the duration of that input pulse which initiated the discharge, said charge in said capacitor being the primary current source for said one of said emitter and collector electrodes thereby to aid in removing said transistor from saturation when said capacitor is discharged.

3. A pulse counter circuit for providing a single output pulse upon the occurrence of a predetermined number of sequential input pulses comprising, in combination: a storage device; means for step charging said storage device with said pulses so as to store a charge proportional to the number of pulses applied thereto; gate means coupled to said storage device for generating an output signal when said stored charge exceeds a predetermined value; discharge means coupled to said gate means and responsive to said output signal for discharging said storage device; said discharge means including a pair of transistor amplifier stages connected in cascade with a positive feedback connection between the output and input ones of said stages, said output stage having its emitter-to-collector circuit serially connected to said storage device whereby the current for said second transistor amplifier stage is supplied by said storage device thereby to rapidly discharge said storage device.

4. A pulse counter circuit for providing a single output pulse upon the occurrence of a predetermined number of sequential input pulses, comprising in combination: a capacitor; means for step charging said capacitor with said pulses so as to store a charge proportional to the number of pulses applied thereto; gate means coupled to said capacitor for providing an output signal when said stored charge exceeds a predetermined value; discharge means coupled to said gate means and responsive to said output signal for discharging said capacitor; said discharge means including a first and a second transistor, each being of opposite conductivity type and having base, emitter and collector electrodes, bias means coupled to each of said electrodes whereby to maintain said first and second transistors normally non-conductive, said first transistor base electrode being coupled to said gate means whereby said output signal causes said first transistor to conduct, said first transistor collector electrode being directly connected to said second transistor base electrode whereby conduction in said first transistor causes conduction in said second transistor, said second transistor emitter electrode being serially and directly connected to said capacitor whereby the charge on said capacitor provides the current for said second transistor emitter electrode thereby to discharge said capacitor, and a diode coupled between said second transistor collector electrode and said first transistor base electrode thereby to increase conduction in said first and second transistors during said discharge whereby said capacitor is discharged more quickly after which said discharge means is rapidly cut off such that said capacitor may again be charged.

5. In a pulse counter circuit including storage means for providing a single output pulse with the occurrence of a predetermined number of sequential input pulses, said circuit including a charging means for step charging said storage means with said pulses so as to store a charge proportional to the number of pulses applied thereto; and detecting means coupled to said storage means for generating an output signal when said stored charge exceeds a predetermined value, the combination comprising discharge means coupled to said detecting means and responsive to said output signal for discharging said storage means, said discharge means including input and an output transistor amplifier stages connected in cascade with a positive feedback connection between said output and input stages, the emitter-to-collector circuit of said output stage being serially connected to said storage means whereby the current for said output stage is supplied by said storage means whereby said storage means is rapidly discharged by said output stage.

6. A transistor circuit for discharging a capacitor when the charge stored therein reaches a predetermined value, said circuit comprising a first and a second transistor each having collector, emitter, and base electrodes, bias means coupled to each of said transistor electrodes for maintaining each of said transistors normally non-conducting, a direct circuit connection between said first transistor collector electrode and said second transistor base electrode such that conduction in said first transistor causes conduction in said second transistor, and a regenerative feedback circuit coupled between said second transistor collector electrode and said first transistor base electrode, said second transistor emitter electrode being serially connected to said capacitor, and pulse means to bias said first transistor to conduct whereby said capacitor is rapidly discharged through said second transistor after which said second transistor rapidly cuts off.

7. In a step counter comprising a capacitive storage device, means adapted to receive a series of input signals to be counted, means responsive to said input signals to charge said storage device by discrete steps, and means to detect when the charge acquired by said storage device has reached a predetermined value, the combination of a discharge circuit for said storage device, said discharge circuit including a first transistor having its emitter-to-collector circuit serially connected to said storage device, and driving means coupled to said first transistor and responsive to said detecting means for driving said first transistor into conduction, thereby to discharge said storage device more rapidly, said driving means including a second transistor of opposite conductivity type to said first transistor, said first and second transistors being connected such that conduction in said second transistor causes conduction in said first transistor, and a regenerative feedback circuit connected between the collector circuit of said first transistor and the input circuit of said second transistor, thereby to drive said first transistor into saturation upon conduction in said second transistor.

References Cited in the file of this patent

UNITED STATES PATENTS

| | | |
|---|---|---|
| 2,866,104 | Biggam | Dec. 23, 1958 |
| 2,953,694 | Wilson | Sept. 20, 1960 |